United States Patent
Yue et al.

(10) Patent No.: US 7,169,679 B2
(45) Date of Patent: Jan. 30, 2007

(54) VARACTOR WITH IMPROVED TUNING RANGE

(75) Inventors: Cheisan J. Yue, Roseville, MN (US); Mohammed A. Fathimulla, Ellicott City, MD (US); Eric E. Vogt, Maple Grove, MN (US); William L. Larson, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 574 days.

(21) Appl. No.: 10/040,395

(22) Filed: Jan. 7, 2002

(65) Prior Publication Data

US 2003/0127691 A1 Jul. 10, 2003

(51) Int. Cl.
*H01L 21/20* (2006.01)
*H01L 21/36* (2006.01)
*H01L 21/336* (2006.01)

(52) U.S. Cl. .................. 438/379; 438/197; 438/479
(58) Field of Classification Search ........ 257/312–313, 257/480, 595–597, 601; 438/379, 479, 197
See application file for complete search history.

(56) References Cited

U.S. PATENT DOCUMENTS

| | | | | |
|---|---|---|---|---|
| 5,038,184 A | * | 8/1991 | Chiang et al. ............ 257/312 |
| 5,045,966 A | | 9/1991 | Alter | |
| 5,563,438 A | * | 10/1996 | Tsang ........................ 257/355 |
| 5,965,912 A | | 10/1999 | Stolfa et al. | |
| 6,100,770 A | * | 8/2000 | Litwin et al. .......... 331/117 FE |
| 6,172,378 B1 | | 1/2001 | Hull et al. | |

FOREIGN PATENT DOCUMENTS

EP    1 024 538 A1    8/2000

OTHER PUBLICATIONS

Analysis and Optimization of Accumulation-Mode Varactor for RF ICs—Soorapanth et al 1998 Symposium on VLSI Circuits Digest of Technical Papers, pp. 32-33, Jun. 1998.
UTSi CMOS: A Complete RF SOI Solution—Analog Integrated Circuits and Signal Processing, 25, 171-179, 2000 Kluwer Academic Publishers.

(Continued)

*Primary Examiner*—Shouxiang Hu
(74) *Attorney, Agent, or Firm*—McDonnell Boehnen Hulbert & Berghoff LLP

(57) ABSTRACT

A varactor has a plurality of alternating P− wells and N+ regions formed in a silicon layer. Each of the P− wells forms a first N+/P− junction with the N+ region on one of its side and a second N+/P− junction with the N+ region on the other of its sides. A gate oxide is provided over each of the P− wells, and a gate silicon is provided over each of the gate oxides. The potential across the gate silicons and the N+ regions controls the capacitance of the varactor.

9 Claims, 4 Drawing Sheets

OTHER PUBLICATIONS

Design of High-Q Varactors for Low-Power Wireless Applications Using a Standard CMOS Process—Porret et al—IEEE Journal of Solid-State Circuits, vol. 35, No. 3, Mar. 2000.

A Metal-Oxide-Semiconductor Varactor—Svelto et al—IEEE Electron Device Letters, vol. 20, No. 4 Apr. 1999.

Mathi, "A SOI-CMOS Process for VLSI Technology", Navy Technical Disclosure Bulletin 10 (1984) Sep., No. 1, pp. 117-121.

Svelto et al., "A Three Terminal Varactor for RFIC's in Standard CMOS Technology", IEEE Transactions on Electron Devices, vol. 47, No. 4, Apr. 2000, pp. 893-895.

* cited by examiner

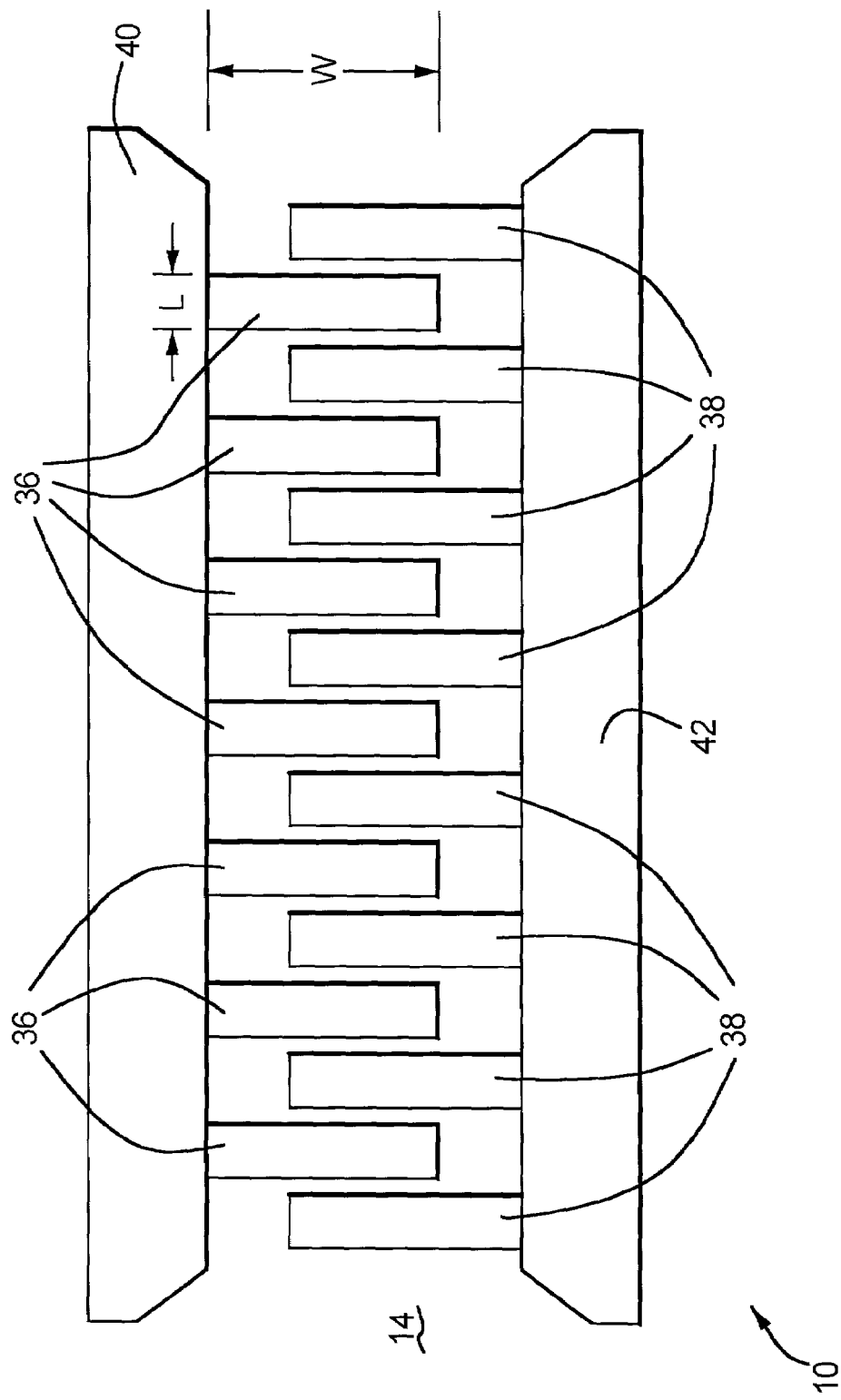

US 7,169,679 B2

VARACTOR WITH IMPROVED TUNING RANGE

TECHNICAL FIELD OF THE INVENTION

The present invention relates to a varactor that has a greater $C_{max}/C_{min}$ ratio so that its tuning range is improved.

BACKGROUND OF THE INVENTION

Modulators, voltage controlled oscillators, and other devices employing varactors have been previously proposed for use in RF applications. A varactor is a device whose capacitance varies with the voltage thereacross. One of the criteria that dictates the design of a varactor for RF applications, particularly for RF wireless applications, is the capacitive switching ratio R. The capacitive switching ratio R is defined as $C_{max}/C_{min}$, where $C_{max}$ is the maximum capacitance of the varactor, and where $C_{min}$ is the minimum capacitance of the varactor.

FIG. 1 is a graph showing the capacitance response of a typical varactor, where capacitance is given along the y-axis and voltage is given along the x-axis. As can be see by the graph of FIG. 1, the capacitive switching ratio of a typical varactor is on the order of 2 to 2.5.

Such a low capacitive switching ratio has limited both the tuning range and the quality factor Q of known varactors. However, higher capacitive switching ratios have been difficult to attain, particularly in RF wireless applications where power consumption is of necessity kept as low as possible.

The present invention is directed to a varactor that is arranged to attain a higher capacitance switching ratio R than that described above.

SUMMARY OF THE INVENTION

In accordance with one aspect of the present invention, a varactor comprises a silicon layer, a P− well in the silicon layer, first and second N+ regions in the silicon layer, a gate oxide above the P− well, and a silicon gate above the gate oxide. The first N+ region forms a first N+/P− junction with the P− well, and the second N+ region forms a second N+/P− junction with the P− well.

In accordance with another aspect of the present invention, a varactor comprises a silicon layer, a plurality of alternating P− wells and N+ regions in the silicon layer, a gate oxide above each of the P− wells, and a silicon gate above each of the gate oxides. Each P− well forms a first N+/P− junction with the N+ region on one side of the P− well and a second N+/P− junction with the N+ region on the other side of the P− well.

In accordance with yet another aspect of the present invention, a method comprises the following: forming a plurality of alternating P− wells and N+ regions in a silicon layer such that each P− well forms a first N+/P− junction with the N+ region on one side and a second N+/P− junction with the N+ region on the other side; forming a plurality of gate oxides, wherein each of the gate oxides is formed above a corresponding one of the P− wells; forming a plurality of silicon gates, wherein each of the silicon gates is formed above a corresponding one of the gate oxides; electrically coupling each of the silicon gates together; and, electrically coupling each of the N+ regions together.

In accordance with a further aspect of the present invention, a varactor is formed by a MOS transistor structure and has a capacitive switching ratio equal to or greater than 5.

BRIEF DESCRIPTION OF THE DRAWINGS

These and other features and advantages will become more apparent from a detailed consideration of the invention when taken in conjunction with the drawings in which:

FIG. 2 is a top view of a varactor according to one embodiment of the present invention;

DETAILED DESCRIPTION

Figure 1:
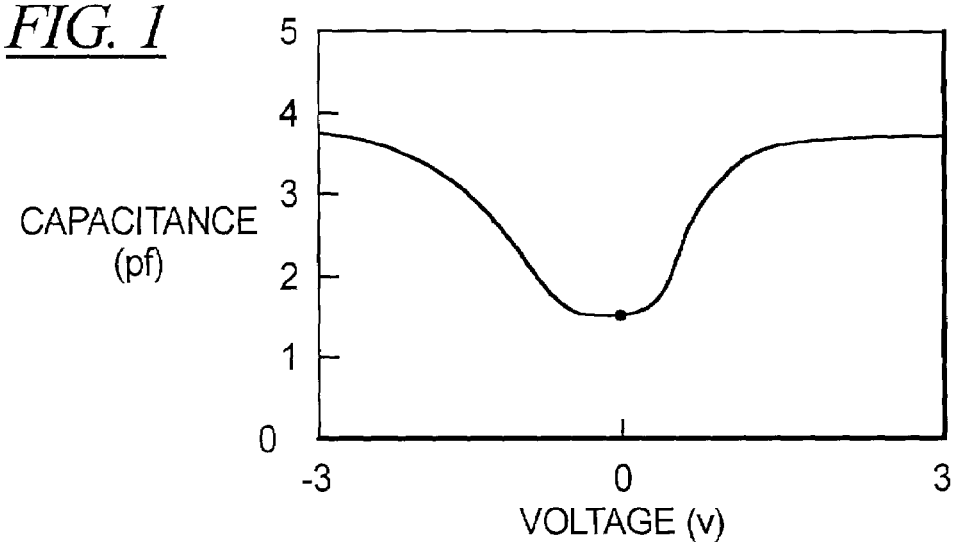
FIG. 1 is a graph showing the capacitance response of a typical varactor.
Figure 3:
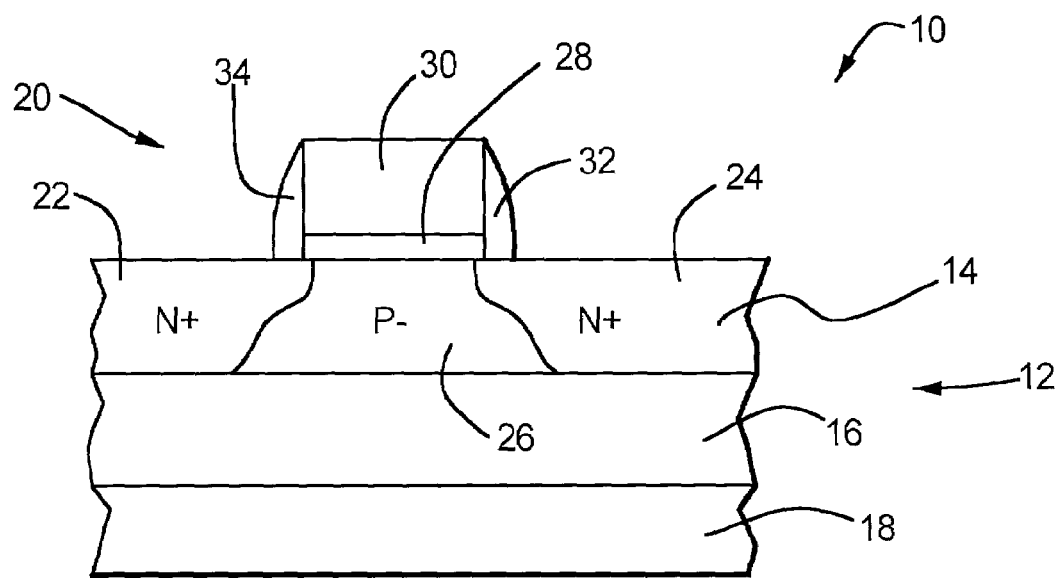
FIG. 3 is a cross-sectional view of a portion of the varactor shown in FIG. 2.

As shown in FIGS. 2 and 3, a varactor 10 is formed on a silicon-on-insulation (SOI) structure 12 having a silicon layer 14 formed over an insulation layer 16. The insulation layer 16 may be formed of an oxide such as $SiO_2$ and, as shown in FIG. 3, is formed over a handle wafer 18. Silicon having a high resistivity may be used for the handle wafer 18. A plurality of MOS transistors is used to construct the varactor 10. A cross-sectional side view of one such transistor 20 is shown in FIG. 3.

As shown in FIG. 3, the silicon layer 14 is doped to form two N+ regions 22 and 24, one of which forms a source and the other of which forms a drain of the transistor 20. The silicon in the silicon layer 14 between the N+ regions 22 and 24 is suitably doped in order to form a P− well 26. A gate oxide 28 is provided over the P− well 26, and a polysilicon gate 30 is provided over the gate oxide 28. The gate oxide 28 and the polysilicon gate 30 are defined by suitable dielectric spacers 32 and 34.

As shown in FIG. 2, the varactor 10 includes a plurality of transistors each of which may be similar to the transistor 20. Thus, the varactor 10 has a plurality of gates 36. In accordance with the varactor 10 as shown in FIG. 3, each of the gates 36 is polysilicon formed over a gate oxide, and each of the gates 36 extends over a corresponding P− well that is also formed in the silicon layer 14. N+ regions 38 are formed in the silicon layer 14 on each side of each of the gates 36. Accordingly, the P− wells and the N+ regions 38 alternate in the silicon layer 14.

Figure 6:
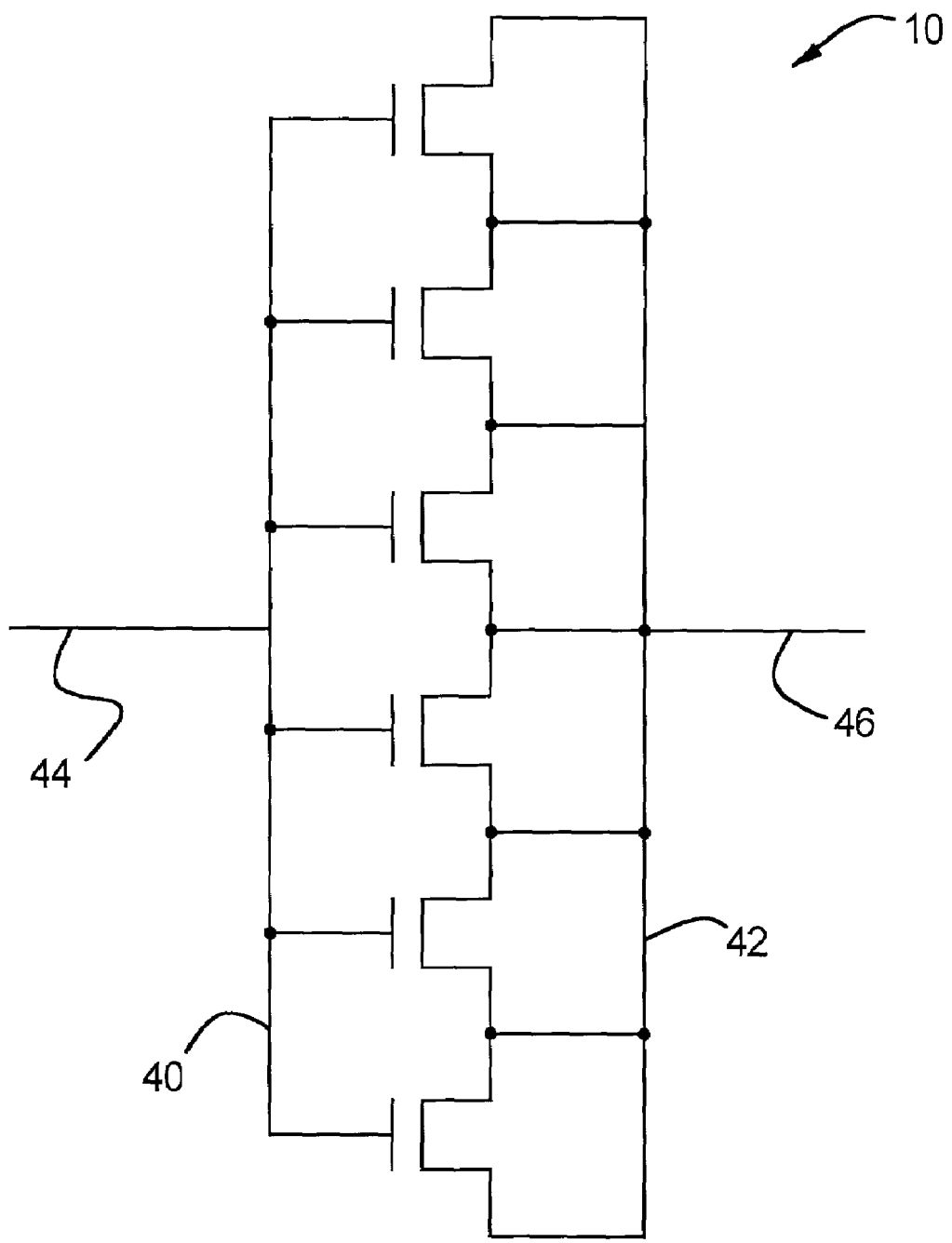

A first metal layer 40 is electrically coupled to each of the gates 36. Similarly, a second metal layer 42 is electrically coupled to each of the N+ regions 38. The varactor 10, whose equivalent circuit is shown in FIG. 6, is coupled across a pair of electrical lines 44 and 46.

As can be seen from FIGS. 2 and 3, the gates 36 are silicon islands fully isolated from the SOI structure 12 by corresponding gate oxides. The P− wells and the N+ regions of each of the transistors making up the varactor 10 extend completely through the silicon layer 14 from the top of the silicon layer 14 to the insulation layer 16. Moreover, the varactor 10 has no P+ to P− direct body contact, and the varactor 10 is formed by using a series of connecting node pairs, where each node pair includes a gate and an N+ region.

The capacitance of the varactor 10 varies according to the voltage applied across the first and second metal layers 40 and 42. As this voltage increases, the varactor 10 moves from the depletion mode to the inversion mode. During this operation, the potential on the body of the transistor (i.e., the P– wells) is allowed to float with respect to the gates and the source and drain regions.

Figure 4:
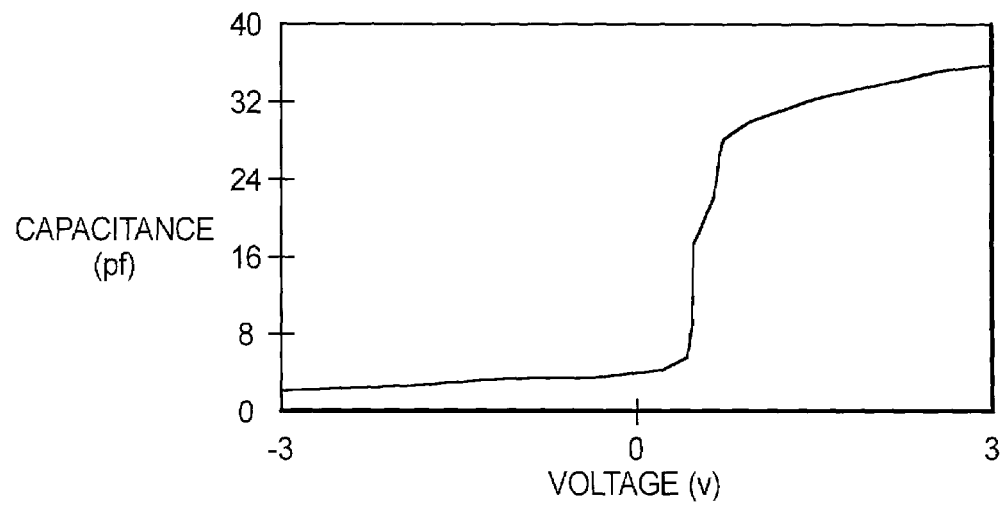
FIG. 4 is a graph showing the capacitance response of a varactor according to one construction of the present invention.

FIG. 4 is a graph showing the capacitance response of the varactor 10, where capacitance is given along the y-axis and the voltage drop applied across the first and second metal layers 40 and 42 is given along the x-axis. The varactor 10 covered by the graph of FIG. 4 has twelve polysilicon gates, where each polysilicon gate has a width W of 110 microns and a length L of 6.8 microns. As can be see by the graph of FIG. 4, the capacitive switching ratio of the varactor 10 in this case is on the order of 33.

Figure 5:
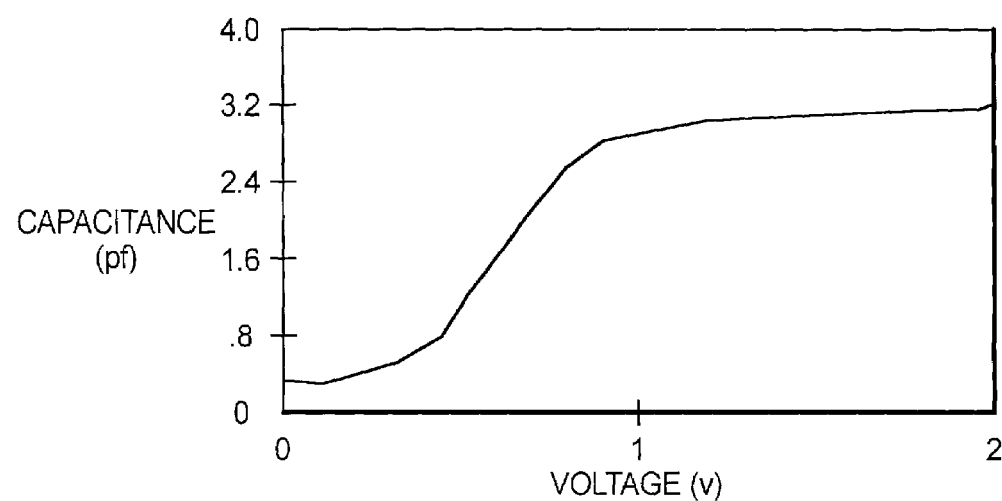
FIG. 5 is a graph showing the capacitance response of a varactor according to another construction of the present invention; and, FIG. 6 is an equivalent circuit diagram for the varactor shown in FIGS. 2 and 3.

FIG. 5 is a graph showing the capacitance response of another construction of the varactor 10. The varactor 10 covered by the graph of FIG. 5 has six polysilicon gates, where each polysilicon gate has a width W of 110 microns and a length L of 1.2 microns. As can be see by the graph of FIG. 5, the capacitive switching ratio of the varactor 10 in this case is on the order of 5.

Certain modifications of the present invention have been discussed above. Other modifications will occur to those practicing in the art of the present invention. For example, as described above, the varactor 10 is formed on an SOI structure. Instead, the varactor 10 may be formed on bulk silicon or SOS (silicon-on-sapphire).

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of making a varactor comprising:
   forming a plurality of alternating P– wells and N+ regions in a silicon layer of an SOI structure, wherein the P– wells form N+/P– junctions with the N+ regions, and wherein each of the P– wells and the N+ regions extends completely through the silicon layer to an insulation layer of the SOI structure;
   forming a plurality of gate oxides, wherein each of the gate oxides is formed above a corresponding one of the P– wells;
   forming a plurality of silicon gates, wherein each of the silicon gates is formed above a corresponding one of the gate oxides;
   electrically coupling each of the silicon gates together: and,
   electrically coupling each of the N+ regions together.

2. The method of claim 1 wherein each of the silicon gates comprises a polysilicon gate.

3. The method of claim 1 wherein the SOI structure includes a layer of high resistivity silicon under the insulation layer over.

4. The method of claim 1 where in the insulation layer comprises sapphire.

5. The method of claim 1 where in the insulation layer comprises an oxide.

6. The method of claIm 1 wherein the P– wells form a transistor body, and wherein the transistor body is allowed to float.

7. The method of claim 1 wherein each of the silicon gates is formed so as to have a width to length ratio of approximately 16 to 1.

8. The method of claim 1 wherein the varactor has a capacitive switching ratio equal to or greater than 5.

9. The method of claim 1 wherein the varactOr has a capacitive switching ratio equal to or greater than 20.

* * * * *